United States Patent [19]
Miyazawa

[11] Patent Number: 5,594,833
[45] Date of Patent: Jan. 14, 1997

[54] RAPID SOUND DATA COMPRESSION IN CODE BOOK CREATION

[76] Inventor: Takeo Miyazawa, Prestige S & T W2, 12-3, Shimorenjaku 4-chome, Mitaka-shi, Tokyo 181, Japan

[21] Appl. No.: 182,105
[22] PCT Filed: May 31, 1993
[86] PCT No.: PCT/JP93/00731
 § 371 Date: Jan. 28, 1994
 § 102(e) Date: Jan. 28, 1994
[87] PCT Pub. No.: WO93/25007
 PCT Pub. Date: Dec. 9, 1993

[30] Foreign Application Priority Data

May 29, 1992 [JP] Japan .................................. 4-138431

[51] Int. Cl.⁶ ..................... G10L 3/02; G10L 9/00
[52] U.S. Cl. ................. 395/2.3; 395/2.31; 395/2.32; 395/2.38
[58] Field of Search ................... 395/2.3, 2.31, 395/2.32, 2.38, 2.45, 2.46, 2.47

[56] References Cited

FOREIGN PATENT DOCUMENTS

| | | |
|---|---|---|
| 4090217 | 3/1992 | Japan . |
| 4196724 | 7/1992 | Japan . |
| 4238416 | 8/1992 | Japan . |

Primary Examiner—Allen R. MacDonald
Assistant Examiner—Indranil Chowdhury
Attorney, Agent, or Firm—Sughrue, Mion, Zinn, Macpeak & Seas

[57] ABSTRACT

The invention aims to provide a sound data compressing method for applying a three-or-more or n-dimensional correlation map in which representative sound values for sorting and making approximation of input sound data are loaded, and for satisfactorily sorting and coding the input sound data with the larger number of dimensions in a shorter period of time, and a sound data reproducing apparatus which, out of a memory for storing sound code data coded by the sound information compressing method, reads the sound code data and reproduces it with a simple construction and a low cost. In a sound data reproducing apparatus 20, a memory 21 stores code book data obtained beforehand by application of an n-dimensional correlation map, an address referring/expansion executing section 23 in a control unit 22 transfers the code book to a data reading/switching section 24 from those addresses in the memory 21 corresponding to index data input through the data reading/switching section 24, and the data reading/switching section 24 temporarily stores the transferred code book data in a buffer 25. Then, the code book data is converted by a D/A converter 26 into an analog signal which is output to an amplifier 27, and the amplifier 27 amplifies the analog signal for driving a speaker or the like.

2 Claims, 13 Drawing Sheets

RAPID SOUND DATA COMPRESSION IN CODE BOOK CREATION

[TECHNICAL FIELD]

The present invention relates to a method for compressing sound data and an apparatus for reproducing the same, and more particularly to a sound data compressing method and a sound data reproducing apparatus with which sound data such as music data or voice data is coded at high efficiency and the coded sound data is reproduced.

[BACKGROUND ART]

Recently, with development of the digital technology, digital recording/storing media such as compact disks (CD's) have been put into practice and used widely. The widespread use of digital recording/storing media are based on development of the A/D conversion technology for converting analog data into digital data. In particular, the technology for A/D converting audio signals such as voice data or music data is prevalent in the fields of domestic audio products and communication data equipment.

Further, because digitizing audio signals increases an amount of data, the compressing/reproducing (coding/decoding) technology for compressing digital data during transmission and reproducing the digital data compressed and transmitted during reception has been developed and practiced in the field of communication data equipment for the purpose of reducing a communication cost. Also, the compressing/reproducing technology for recording and storing a larger amount of digital data has been researched and developed in the fields of communication data equipment and domestic audio products, aiming at not only a higher compression rate but also improved sound quality in auditory sense. As one high-efficient coding technique intended for a higher compression rate and improved sound quality in auditory sense for audio signals in digital recording/storing media, there is proposed a high-efficient coding technique for audio signals using subband coding and auditory characteristics, for example, as described in "Nikkei Electronics", Jul. 22, 1991 and Aug. 5, 1991. With this high-efficient coding technique, an input signal is sampled and divided to form frames each comprising 384 samples, these frames are classified one by one through band-pass filters (band width; 750 Hz) for each of bands, and bit allocation for each band is determined based on a threshold obtained from an auditory masking effect (using an amplitude spectrum with 512-point FFT) and a minimum audible limit characteristic (with simple tone of 1 kHz as reference), thereby compressing audio signals (sampling frequency; 48 kHz, quantization; 16 bits), comparable to those used in CD's, into 128 kbits/sec.

FIG. 11 shows a block diagram based on a basic algorithm of the high-efficient coding technique for audio signals using subband coding and auditory characteristics. In FIG. 11, it is assumed that an input signal is processed in units of frames each corresponding to 8–20 ms (about 384–1000 samples) and a group of 32 band-pass filters are used for the subband coding. A block denoted by 1 in the drawing is a subband coding block. The subband coding block 1 includes a group of band-pass filters (BPF1–BPF32) each comprising an FIR type polyphase filter with 64–512 taps. Output signals of the band-pass filter group are each converted into a base band signal through a thinning-out process in a thinning-out block, coded in a quantizing/coding block, and then output as coded data. In parallel to the above coding process, with in an auditory characteristic block denoted by 2 in the drawing, the input signal is subjected to 512 to 1024-point FFT (Fast Fourier Transform) in an FFT block for determining an amplitude spectrum. Subsequently, a threshold of the amplitude spectrum is obtained in a threshold calculating block within the auditory characteristic block 2 by applying models of an auditory masking effect and a minimum audible limit characteristic. Bit allocation for output signals of the band-pass filters are determined from the threshold. Then, the coded data is combined with auxiliary data (such as bit allocation and a scale factor for quantization) in a multiplexing block within the subband coding block followed by delivering final output signal at 128 kbits/sec.

In other words, the subband coding is a coding technique with which an input signal is divided into a plurality of frequency bands by the use of band-pass filters, and auditory characteristics (auditory masking effect and minimum audible limit characteristic) are positively utilized in judgment of a data amount (bits) to be allocated for each band to remove inaudible frequency components, thereby realizing the data compression. Utilizing such a subband coding and auditory masking effect requires a lot of filter operations and hence operation processing using a plurality of DSP (Digital Signal Processors).

In the field of the quantizing technology for digitalizing audio signals, vector quantization is also known as a technique which has been developed since 1980's. The vector quantization is a quantizing method with which a set (vector) of plural values is expressed together by one code, with an intention of directly utilizing redundancy between sample values for data compression.

The vector quantization is carried out as follows. The same quantization representative vectors are stored in both the transmission and reception sides. In the transmission side, a plurality of sample values are quantized together as a vector. For example, after sampling an input waveform, series of two-dimensional vectors each comprising two successive sample values as elements are produced. Upon receiving one of the two-dimensional vectors, one of the two-dimensional quantization representative vectors stored in both the transmission and reception sides which is closest to the input vector, is selected and an index of the selected vector is transmitted to the reception side after coding it. The reception side issues the quantization representative vector in accordance with the transmitted index. In other words, the vector quantization is to divide an input waveform into waveform segments in units of sample values each having a constant length, select one of finite waveform pat terns expressed in the form of quantization representative vectors which is most close to the waveform segment, and further replace the other waveform segments with such waveform pat terns successively, thereby compressing input data.

Accordingly, conditions affecting a performance of the quantization lie in how to search for the quantization representative vector which provides a minimum strain with respect to the input vector. To express such optimizing conditions in terms of two-dimensional space, for example, when a K-dimensional signal space in which the input vector exists is divided into N areas which are not overlapped with each other, N pieces of quantization representative vectors loaded to the N areas in one-to-one relation are each given as the centroid of the corresponding area. Each area satisfying the above optimizing conditions is called a "Voronoi area" and a manner of the division is called "Voronoi division". In the quantizing operations to determine the Voronoi areas, the number of levels N (a set of quantization representative vectors to be replaced with the input vector:

code book number) is provided by $2^{K \cdot R}$ if a coding rate R and the number of dimensions K per sample are specified. From that calculation, the memory capacity required for loading the quantization representative vectors is given by N×K.

For designing a vector quantizer to carry out such a vector quantizing process, there is known a design method, called an LBG algorithm, using a learning series. In the LBG algorithm, starting from an appropriate initial code book, dividing conditions and representative point conditions are repeatedly applied to the learning series so that convergence into a satisfactory code book is achieved. A process flow of the LBG algorithm is shown in FIG. 12 and described below with reference to the drawing.

Note that expressions denoted by "X, Y" in the following description represent vectors.

In FIG. 12, initialization is first performed in step P1. It is assumed that the initialization sets the number of dimensions K, the number of levels N, an initial code book $C_N^{(0)}$ comprising N pieces of initial quantization representative vectors $Y_1^{(0)}, Y_2^{(0)}, \ldots, Y_N^{(0)}$, a learning series T comprising L pieces of K-dimensional learning vectors $X_1, X_2, \ldots, X_L$, and a convergence determining threshold $\epsilon$. Additionally, m=0 and an initial strain $D^{(-1)}=\infty$ are also set. Then, a process of applying dividing conditions and calculating an average strain is performed in step P2. In this calculation process, the dividing conditions for division $P_N^{(m)}$ of the learning series T into N areas $P_1^{(m)}, P_2^{(m)}, \ldots, P_N^{(m)}$ so that the average strain becomes minimum under a code book $C_N^{(m)}$ comprising quantization representative vectors $X_1^{(m)}, Y_2^{(m)}, \ldots, Y_N^{(m)}$, are determined by applying the following equation (1):

$$d(X, Y_i) \leq d(X, Y_j) \tag{1}$$

In other words, the area $P_i^{(m)}$ corresponding to the quantization representative vectors $Y_i^{(m)}$ is given by a set of those learning vector which provides a minimum strain with respect to $Y_i^{(m)}$ of the N quantization representative vectors. Thus, the L learning vectors are divided into the N areas. The average strain $D^{(m)}$ is also calculated which is produced when the learning vectors belonging to each area are replaced with the quantization representative vector in that area.

Thereafter, a convergence determining process is performed in step P3. If $(D^{(m-1)}-D^{(m)}/D^{(m)}<\epsilon)$ is satisfied in the convergence determining process, then the process is stopped and the code book $C_N^{(m)}$ is output in step P4 as a finally designed code book of N levels. If the convergence is not determined, then the process goes to step P5. Step P5 carries out a process of applying representative point conditions. In this application process, a code book $CC_N$ comprising N pieces of quantization representative vectors $Y_1, Y_2, \ldots, Y_N$, which provide a minimum average strain with respect to the learning series T divided into the N areas $P_1^{(m)}, P_2^{(m)}, \ldots, P_N^{(m)}$, is determined by applying representative point conditions given by the following equation (2):

$$Y_i = (\int_{p_i} X \cdot p(X) dx) / (\int_{p_i} p(X) dx) \tag{2}$$

In other words, the centroid provided as an average vector of the learning vectors belonging to the area $P_i^{(m)}$ is set to the quantization representative vector $Y_i$. Subsequently, replacement of m←m+1 and of $CC_N$ with a code boor $C_N^{(m)}$ is executed in step P6, followed by returning to step P1.

Whether the code book designed by the above algorithm is satisfactory or not strongly depends on the initial code book $C_N^{(0)}$ and a method of selecting the learning series It is desired that the initial code book $C_N^{(0)}$ covers a distribution range of supposed input vectors.

On the other hand, the learning series T must include a number of learning vectors enough to represent characteristics of supposed input vectors. If the number of learning vectors is small, a desired result would not be obtained for an input vector series different from the learning series. In order to prevent such an event, it is empirically known that the number of learning vectors must be on the order of at least several tens to hundred times the number of levels N.

However, the prior art high-efficient coding techniques mentioned above have had the problems below. In the subband coding technique, because auditory characteristics (auditory masking effect and minimum audible limit characteristic) are positively utilized to remove inaudible frequency components for thereby realizing the data compression, a lot of filter operations are required; a plurality of band-pass filters and DSP's are required. This complicates not only the circuit configuration but also operation processing, and increases a production cost.

Further, in the above-mentioned vector quantization, the memory capacity necessary for storing the quantization representative vectors increases in an exponential function of the number of dimensions K and the coding rate R, and the quantizing operations require N×K times multiplications for each input vector, which rapidly increases an amount of quantizing operations. Therefore, enlarging the number of dimensions will encounter a limit and the feasible number of dimensions is about eight. It is thus impossible to determine the quantization representative vectors in the higher number of dimensions than eight by any existing computer within the practical finite range of time.

Stated otherwise, the above prior art LBG algorithm for designing the vector quantizer aims at convergence to a satisfactory code book by applying the foregoing equation (1) as dividing conditions for the division $P_N^{(m)}$ of the learning series T, and applying the foregoing equation (2) as representative point conditions for the code book $CC_N$ comprising the N pieces of quantization representative vectors $Y_1, Y_2, \ldots, Y_N$ which minimizes the average strain, while alternately applying those equations in a repeated manner. However, convergence to an optimum code book is not always ensured. Also, that design method for the vector quantizer can determine the above-mentioned Voronoi division through quantizing operations within the practical finite range of time when the number of dimensions is as low as one or two, but it is not realistic when the number of dimensions K is set to a larger value in conformity with practical input vectors, because a period of time required to execute quantizing operations for determining the Voronoi division is rapidly increased in an exponential function, making the operations difficult to execute.

In view of the above, there has also been an attempt to approach, by using the neural network technology, the various problems experienced when the prior art vector quantizing method is used to determine the code book satisfying the Voronoi division.

A neural network is directed to solve those problems which are beyond a capability of sequential processing type computer systems having been so far developed, by using parallel processing type computer systems in which a plurality of processors are closely coupled to each other for realization of parallel processing after the example of brain's nerve cells, and it exhibits a superior ability for, in particular, problems related to patterns such as pat tern mapping, pattern perfection and pattern recognition. Voice synthesis and voice recognition are one example of the fields including many those problems related to pattern recognition, and various methods having been proposed in the neural network technology are applicable to voice recognition. Various neural network techniques can be grouped in terms of pattern sorters depending on whether an input signal takes a binary pattern or a continuous value, whether coupling efficiency is learned with a teacher or without a teacher, and so on. When applying any neural network technique to voice recognition, the technique adapted for an input pattern taking a continuous value is employed because voices are continuously changed in time series. Of the neural network techniques adapted for continuous values, the technique using a teacher includes a perceptron, a multilayered perceptron, etc., and the technique using no teacher includes a self-organizing feature mapping. Then, one of those neural network techniques which realizes the Voronoi division in the above-mentioned vector quantizing method is a self-organizing feature mapping.

The self-organizing feature mapping is a mapping technique for neural networks proposed by Kohonen at the Helsinki University, and its network structure is simple because learning is made without a teacher. Thus, the network structure comprises neurons in the form of combined layers interconnected on a layer-by-layer basis and input synapses coupled to all the combined layers. In the self-organizing feature mapping, summation of products of an input signal and synapse loads is calculated and one particular neuron in the combined layers is brought into an output state. The synapse loads are then changed so that the particular neuron brought into an output state and other neurons in the vicinity thereof react most sensitively with a similar input signal. At this time, since the neuron first brought into the highest output state seems to maximize its output in competition with the other neurons for the same input signal, such a learning process is also called coordinate learning. This coordinate learning gives rise to a phenomenon that when reactivity of a particular neuron is raised for an input signal, reactivity of those neurons which are positioned at short distance from that neuron is also raised concomitantly, but reactivity of those neurons which are positioned outside the above neurons is lowered conversely. Those neurons of which reactivity is raised owing to such a phenomenon are called a "bubble" together. In other words, the basic operation of the self-organizing feature mapping resides in generating a particular "bubble" on the two-dimensional plane of neurons in accordance with an input signal. Then, synapse loads for neural network are automatically modified so that the "bubble" reacts selectively with a particular input signal (stimulus) while gradually growing up. As a result of the above operation, the particular input signal is eventually made correspond to the "bubble", making it possible to automatically sort the input signal.

Accordingly, the pattern data which is eventually sorted and output by virtue of the synapse loads in the self-organizing feature mapping corresponds to the quantization representative vector which is obtained by the above-mentioned vector quantizing method as the centroid in the Voronoi division.

However, the method for sorting an input signal by the use of the self-organizing feature mapping has been tried only for a map configuration of the two-dimensional plane in the past. This has raised the problem that as illustrated in FIG. 13, for example, an input signal may not thoroughly be sorted in the two-dimensional plane with the occurrence of a "distortion", and the input signal corresponding to the "distortion" part will not reach a coincidence and hence cannot be sorted. In the case of sorting and coding sound data by the use of the two-dimensional self-organizing feature mapping, for example, if any "distortion" occurs in the map, the sorting of the coded sound data is not performed with a good result; i.e., a code book in the vector quantizing method is not converged satisfactorily, leading to that the reproduced sound is not clear when hearing it and high-efficient coding of sound data utilizing the self-organizing feature mapping is impeded from being put into practice.

Further, in order to correct the "distortion" caused by the self-organizing feature mapping in the two-dimensional plane and obtain a good sorting result, a great deal number of learning times is required, which also impedes practical use of the self-organizing feature mapping.

[DISCLOSURE OF THE INVENTION]

Therefore, an object of the present invention is to provide a sound data compressing method in which a three-or-more or n-dimensional correlation map is applied to correct a "distortion" caused by the self-organizing feature mapping for satisfactorily sorting an input sound information pattern in higher dimensions more suited to practical use for a shorter time, thereby realizing high-efficient coding, and a sound data reproducing apparatus which has a simple hardware configuration and is produced at a lower cost, with such an arrangement that a memory for storing sound code data coded by using the sound data compressing method is provided and the sound code data is read from the memory and reproduced.

To achieve the above object, a sound data compressing method according to the invention as claimed in claim 1, resides in a sound data compressing method with which, when a series of sound data are sampled at predetermined time intervals and input as a sound data pattern in units of the predetermined number of samples, said input sound data pattern is replaced by an representative sound value for sorting and approximation of said input sound data pattern, said representative sound value being coded, thereby compressing said series of sound data, said method including:

map forming means for forming a plurality of division regions, in which representative sound values for sorting and making approximation of said input sound data pattern in accordance with change in said input sound data pattern are loaded as the centroids, into a three-or-more or n-dimensional correlation map, and for modifying the representative sound values as the centroids of said respective division regions depending on change in said input sound data pattern to update said n-dimensional correlation map, and coding means for converting the representative sound values, which are loaded in said respective division regions of said correlation map formed by said map forming means, into predetermined code data, whereby the representative sound values as the centroids of said respective division regions are modified depending on change in said input sound data pattern to update said three-or-more or n-dimensional correlation map, and the representative sound values of said updated correlation map are converted into predetermined code data, thereby compressing the input sound data.

Also, a sound data compressing method according to claim 2 resides in that said map forming means in claim 1 comprises:

initial value setting means for setting initial values, which are weighted for each of said plural division regions, so as to set said plural representative sound values, presenting means for presenting said input sound data pattern to the initial values for said respective plural division regions set by said initial value setting means, distance calculating means for calculating distances between said input sound data pattern presented by said presenting means and the initial values for said respective plural division regions in directions of three-or-more or n-dimensions, and update means for updating the plural representative sound values for said respective plural division regions based on a result calculated by said distance calculating means, thereby updating said three-or-more or n-dimensional correlation map.

Further, a sound data reproducing apparatus according to claim 3 comprises:

sound code storing means for storing a plurality of representative sound code data for sorting and making approximation of a series of sound data patterns, which are obtained by sampling resources to be reproduced such as music data or voice data at predetermined time intervals, in units of the predetermined number of samples, reproduction sequence storing means for storing reproduction sequence data to reproduce said plural representative sound code data stored in said sound code storing means in the same sequence as said input sound data patterns, reading means for selectively reading said plural representative sound code data stored in said sound code storing means in accordance with the reproduction sequence data stored in said reproduction sequence storing means, and reproducing means for reproducing said representative sound code data read by said reading means.

In addition, a sound data reproducing according to claim 4 resides in that said sound code data stored in said sound code storing means is provided as code data resulted from said coding means by converting the representative sound values obtained from said three-or-more or n-dimensional correlation map by said map forming means in accordance with said sound data compressing method according to claim 1.

According to the invention as claimed in claim 1, a plurality of division regions, in which representative sound values for sorting and making approximation of the input sound data pattern in accordance with change in the input sound data pattern are loaded as the centroids, are formed into a three-or-more or n-dimensional correlation map by the map forming means, which also modifies the representative sound values as the centroids of the respective division regions depending on change in the input sound data pattern to update the n-dimensional correlation map, and the coding means converts the representative sound values, which are loaded in the respective division regions of the correlation map, into predetermined code data, thereby compressing the input sound data.

In the map forming means for use with the above case, as described in claim 2, the initial value setting means sets initial values, which are weighted for each of the plural division regions, so as to set the plural representative sound values, the presenting means presents the input sound data pattern to the initial values for the respective plural division regions set by the initial value setting means, the distance calculating means calculates distances between the input sound data pattern presented by the presenting means and the initial values for the respective plural division regions in directions of three-or-more or n-dimensions, and the update means updates the plural representative sound values for the respective plural division regions based on a result calculated by the distance calculating means, thereby updating the three-or-more or n-dimensional correlation map.

Accordingly, since the update operations processing for sorting the input sound data pattern in the larger number of dimensions is carried out by using the three-or-more or n-dimensional correlation map, the number of times of operations can be cut down remarkably, the sorting result can be obtained within the practical range of time for operations by existing computers, and further the input sound data pattern can be sorted satisfactorily with the less number of the representative sound values than conventionally.

According to the invention as claimed in claim 3, a sound data reproducing apparatus is arranged such that a plurality of representative sound code data for sorting and making approximation of a series of sound data patterns, which are obtained by sampling resources to be reproduced such as music data or voice data at predetermined time intervals, in units of the predetermined number of samples are stored in the sound code storing means, reproduction sequence data to reproduce the plural representative sound code data stored in the sound code storing means in the same sequence as the input sound data patterns is stored in the reproduction sequence storing means, the reading means selectively reads the plural representative sound code data stored in the sound code storing means in accordance with the reproduction sequence data stored in the reproduction sequence storing means, and the reproducing means reproduces the representative sound code data read by the reading means.

In this case, as described in claim 4, the plural representative sound code data stored in the sound code storing means may be provided as, for example, code data resulted from the coding means by converting the representative sound values obtained from the three-or-more or n-dimensional correlation map by the map forming means in accordance with the sound data compressing method according to claim 1.

Accordingly, music data and voice data, as resources to be reproduced, can be stored in the form of representative sound code data after compression by coding with a less memory capacity, the sound data can be reproduced simply by reading the representative sound code data out of the memory in accordance with a simple algorithm without requiring complicated operations processing, and further a circuit configuration can be simplified. As a result, a small-size sound data compressing apparatus is realized at a lower cost.

[BEST MODE FOR CARRYING OUT THE INVENTION]

Hereinafter, embodiments will be described with reference to FIGS. 1 to 10.

A description will first be given on the basic concept of a sound data compressing method according to claims 1 and 2.

The following embodiments are featured in that, for the purpose of separating an input sound data pattern satisfactorily by correcting a "distortion" on the two-dimensional plane which has been the problem raised when applying a self-organizing feature map (hereinafter referred to as a Kohonen map) of two dimensions to the vector quantizing method explained before in connection with the prior art, an n-dimensional Kohonen map is employed.

Figure 1:
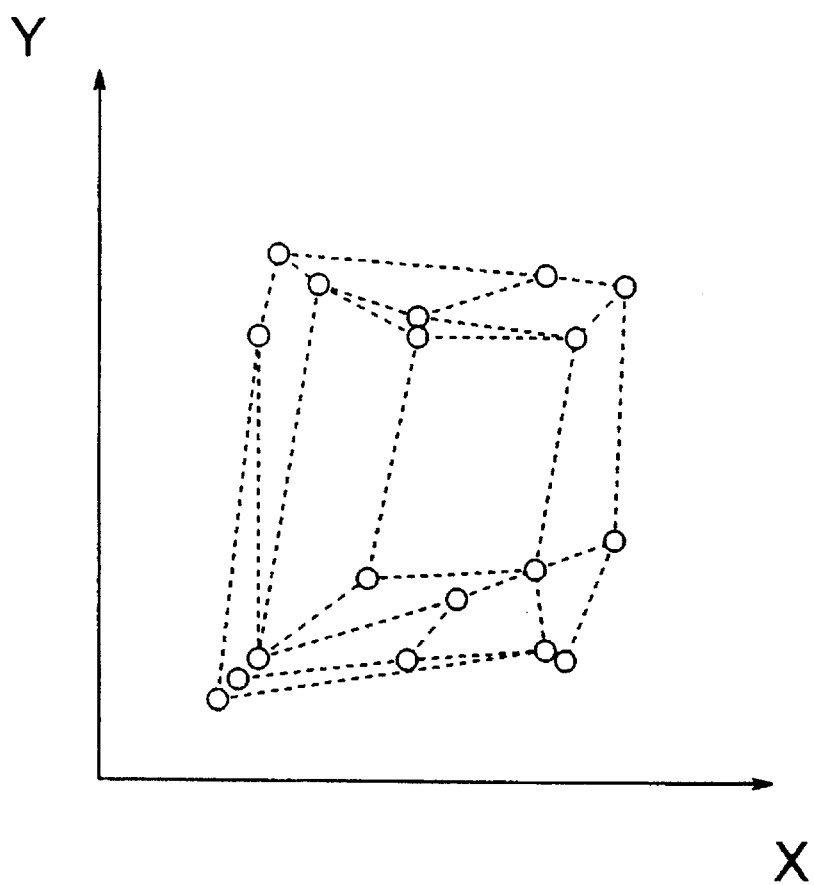
FIG. 1 is a graph showing a two-dimensional Kohonen map for explaining the basic concept of the invention according to claims 1 and 2.
Figure 2:
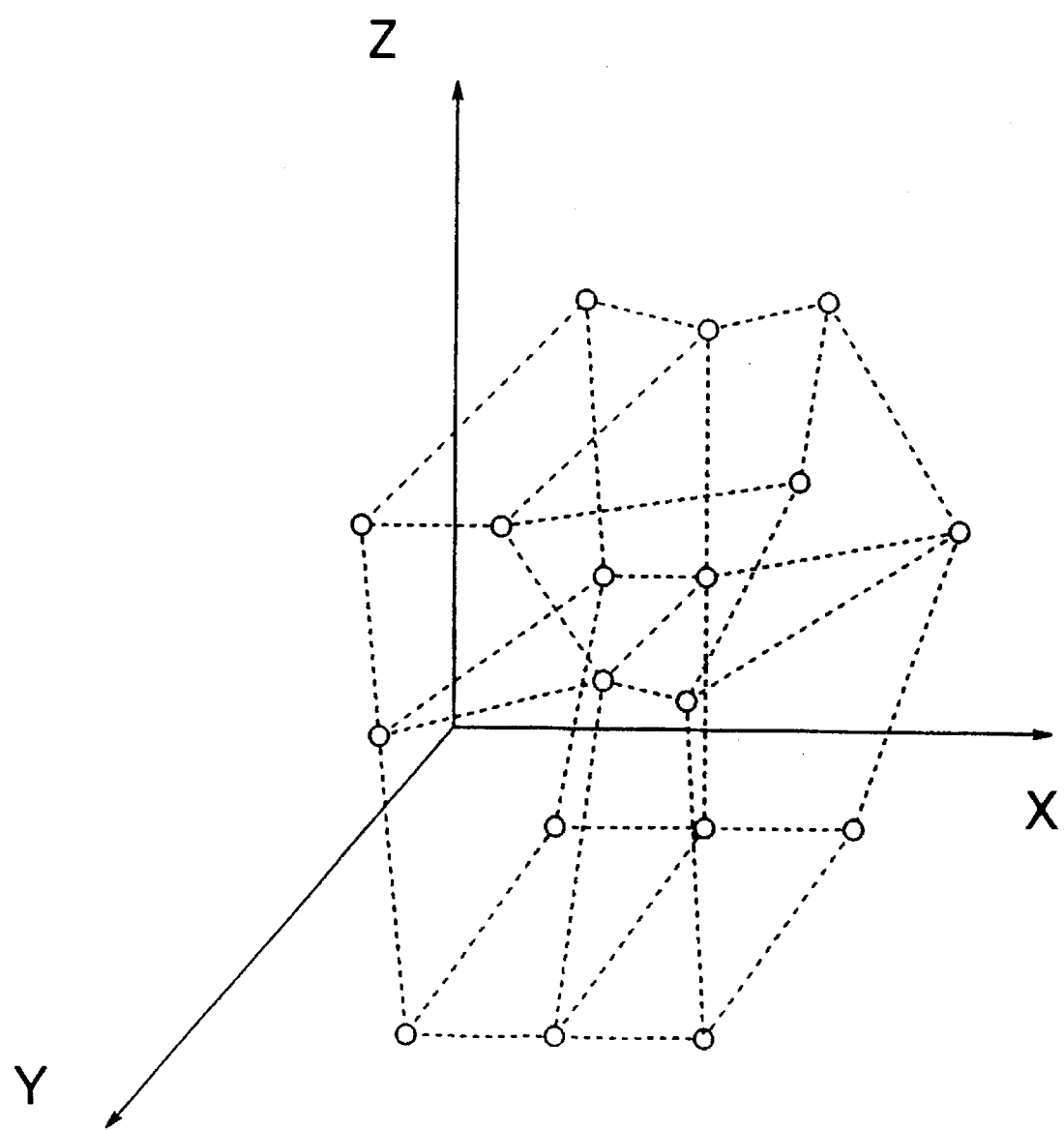
FIG. 2 is a graph showing a three-dimensional Kohonen map for explaining the basic concept of the invention according to claims 1 and 2.

By way of example, FIG. 1 shows a Kohonen map formed in two dimensions, and FIG. 2 shows a Kohonen map resulted from expanding the two-dimensional Kohonen map of FIG. 1 into three dimensions.

It will be apparent that while such synapse loading points as being not vertically separated from each other in the two-dimensional plane are considerably observed in FIG. 1, expansion into the three-dimensional map enables those synapse loading points to be satisfactorily separated from each other. In other words, by applying a three-or-more or n-dimensional Kohonen map to an input sound data pattern, even that pattern which would otherwise be sorted without finding out a coincidence due to the occurrence of a "distortion" can be sorted, and the number of learning times necessary for correction can be cut down to a large extent.

The embodiments will be described below on the basis of the above-explained basic concept.

Figure 3:
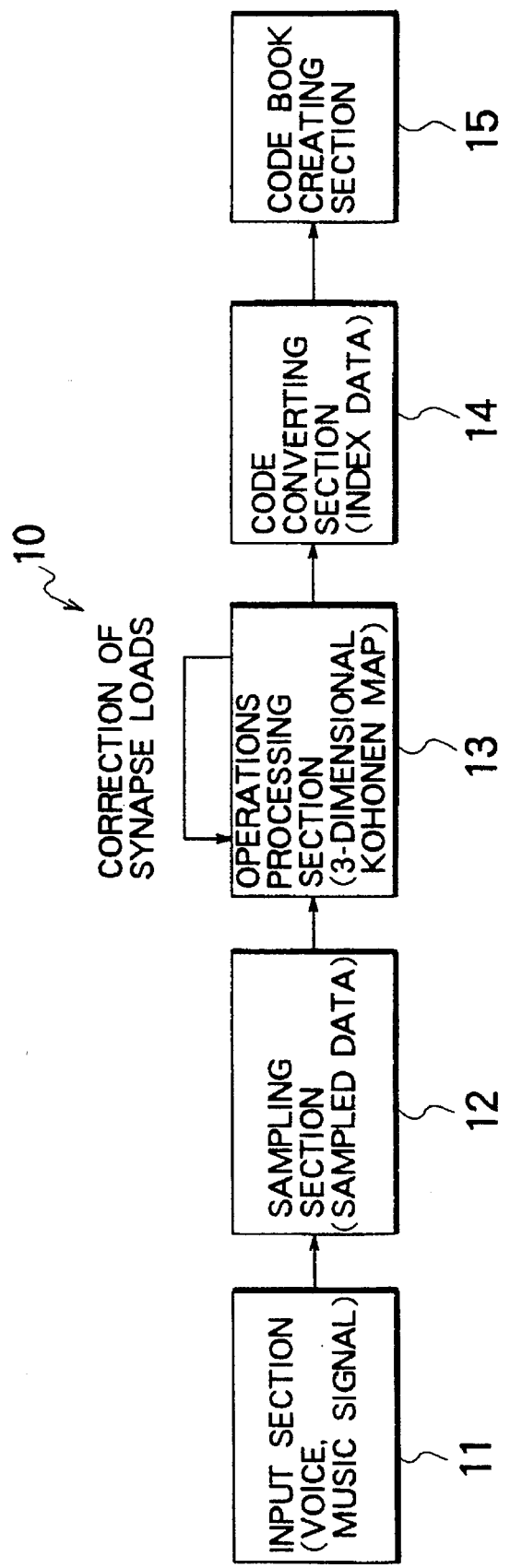
FIG. 3 is a block diagram of a sound data compressing apparatus.
Figure 4:
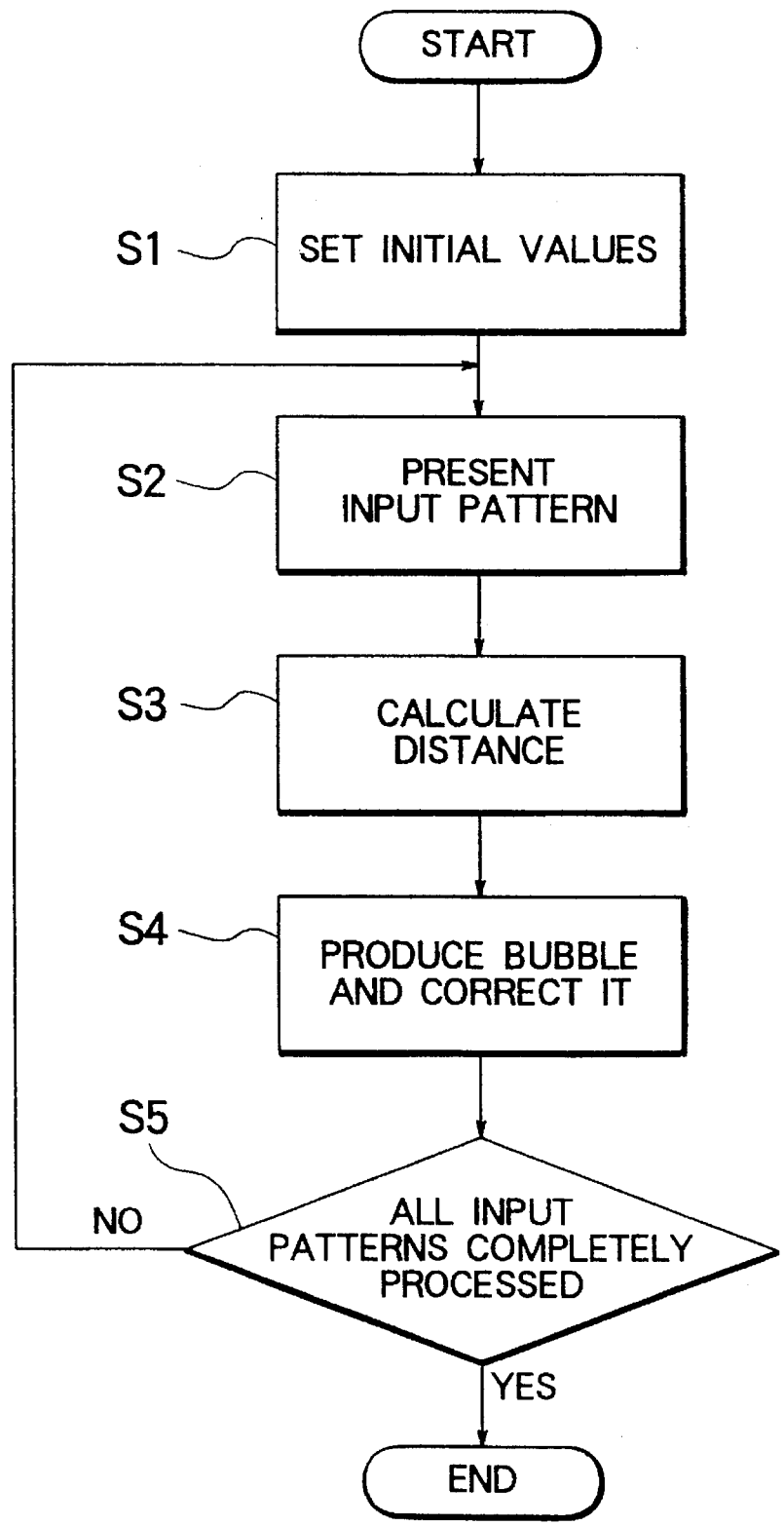
FIG. 4 is a flowchart of a learning algorithm processed by an operations processing section in FIG. 3.
Figure 5:
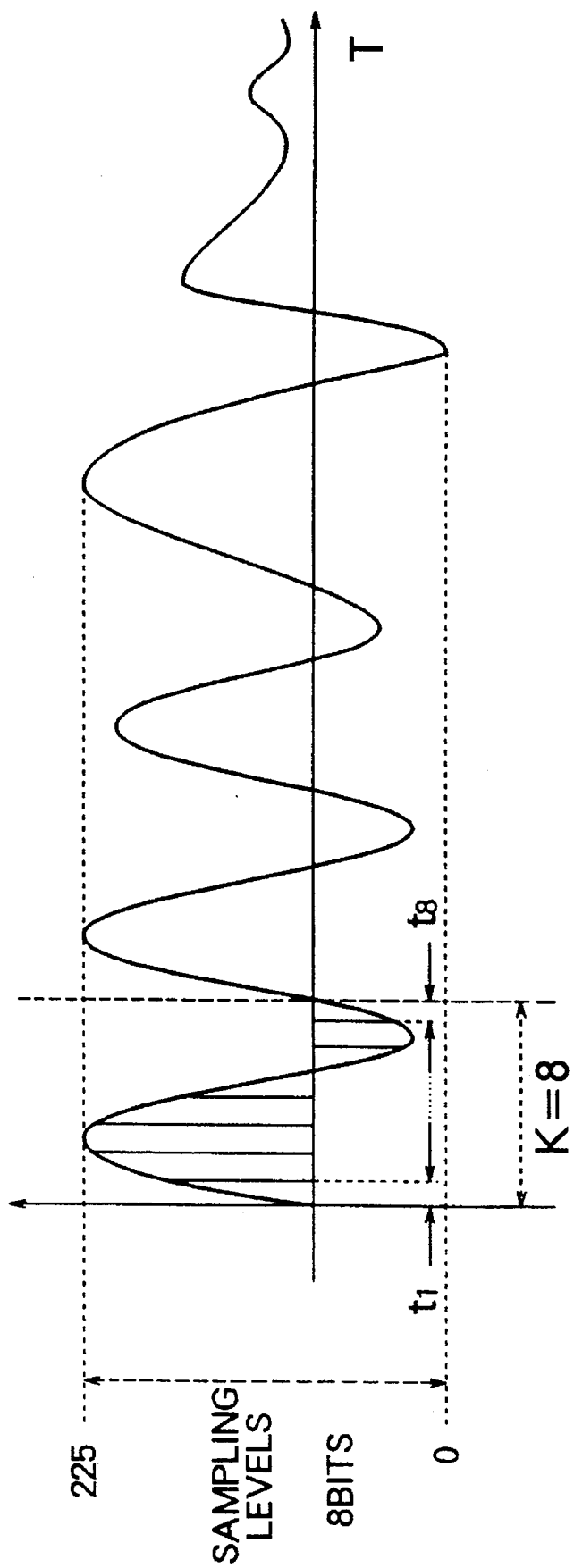
FIG. 5 is a chart showing one example of input sound data compressed by the sound data compressing apparatus shown in FIG. 3.

FIGS. 3 to 5 show one embodiment of a sound data compressing apparatus 10 to which the sound data compressing method of the present invention is applied.

A description will first be given on the apparatus configuration. FIG. 3 is a block diagram of the sound data compressing apparatus 10. In the drawing, the sound data compressing apparatus 10 is constituted by an input section 11 to which a voice or music signal is input, a sampling section 12 for sampling the voice or music signal input to the input section 11 at a predetermined sampling frequency and outputting a sound data pattern, an operations processing section 13 for executing operations processing to sort the sound data pattern sampled by the sampling section 12 into a predetermined representative sound value based on an n-dimensional Kohonen map, a code converting section 14 for converting the representative sound value sorted by the operations processing section 13 into predetermined code data, and a code book creating section 15 for creating a code book in accordance with an index of the code data converted by the code converting section 14.

The input section 11 converts the voice or music data input thereto into a predetermined analog signal and outputs it to the sampling section 12.

The sampling section 12 is constituted by an A/D converter, etc. and functions to sample the analog signal at predetermined sampling intervals (sampling frequency) and then output the sampled data to the operations processing section 13.

The operations processing section (map forming means, initial value setting means, presenting means, distance calculating means and update means) 13 is constituted by a CPU (Central Processing Unit), a RAM (Random Access Memory), etc. The CPU divides the sampled data applied from the sampling section 12 into blocks each having the number of dimensions K, and sorts the sampled data into a predetermined representative sound value for each block in accordance with a learning algorithm which is stored in the RAM and based on the three-dimensional Kohonen map shown in FIG. 2, followed by outputting the representative sound value to the code converting section 14.

The code converting section 14 replaces the representative sound value applied from the operations processing section 13 by a predetermined index data, and then outputs the index data to the code book creating section 15.

The code book creating section 15 creates a code book adapted for the prior art vector quantizing method, explained before, depending on the index data applied from the code converting section 14.

The operation of this embodiment will now be described.

First, when a series of voice or music data are input to the input section 11, each data is converted into a predetermined analog signal which is output to the sampling section 12. After that, the sampling section 12 samples the analog signal at the predetermined sampling intervals, divides the sampled data into blocks each having the number of dimensions K, and then output those blocks to the operations processing section 13. In the operations processing section 13, the input sampled data is sorted into a predetermined representative sound value in accordance with the learning algorithm based on the three-dimensional Kohonen map. The learning algorithm executed by the operations processing section 13 will now be described with reference to a flowchart shown in FIG. 4.

Referring to FIG. 4, a process of setting initial values is first performed in step S1. In the initial value setting, initial values of synapse loads initially applied from the input sampled data to neurons are set to be dispersed by using random numbers. Then, a process of presenting an input pattern is performed in step S2. In this input pattern presenting process, any input pattern is provided as the input sampled data. At this time, for simplification of a distance calculating process in step S3, the input pattern is required to be normalized. It is here supposed that the normalization is achieved on assumptions expressed by the following equations (3) and (4):

$$dW_{ij}/dt = \alpha(x_i - W_{ij}) \quad (3)$$

$$dW_{ij}/dt = 0 \quad (4)$$

where $W_{ij}$: snyapse load $x_i$: input pattern (input sampled data)

α: positive constant

Note that these assumptions are determined based on the following equation (5) which defines the learning operation in the Kohonen model:

$$dW_{ij}/dt=\alpha O_i x_i - \beta(O_i)W_{ij} \quad (5)$$

where $O_1$: reactivity $\beta(O_i)$: such a function that a constant term becomes 0 when the second term in the right side is subjected to the Taylor's expansion Thereafter, the distance calculating process is performed in step S3. The distance calculation is to determine a neuron p which is the center of the Voronoi division (bubble) in the foregoing three-dimensional map of FIG. 2. At this time, if the input pattern presented in step S2 is normalized by meeting the assumptions of the above equations (3) and (4), the neuron locating at the center of the Voronoi division (bubble) is determined by calculating the distances between vectors of the input pattern $x_i$ and the synapse loads $W_{ij}$. In other words, it is required to determine a neuron j which minimizes $D_j$ in the following equations (6) and (7):

First, the equation (6) for the case where the code book is in number nx and one-dimensional is expressed below:

$$D_j = \sum_{j=0}^{nx} \sum_{i=0}^{n} (x_i(t) - W_{ij}(t))^2 \quad (6)$$

Next, the equation (7) for the case where the code book is in number nx, ny, nz and three-dimensional is expressed below:

$$D_{jkl} = \sum_{j=0}^{nx} \sum_{k=0}^{ny} \sum_{l=0}^{nz} \sum_{i=0}^{n} (x_i(t) - W_{ijkl}(t))^2 \quad (7)$$

After that, a process of correcting $W_{ij}$ is performed in step S4. In the correction process, those neurons which locate in the vicinity of the neuron p selected in step S3 are corrected together based on the following equations (8), (9) in conformity with the above equations (6), (7), respectively:

$$W_{ij}(t + 1) = W_{ij}(t) + \alpha(t)[x_i(t) - W_{ij}(t)]^2 \quad (8)$$

$$W_{ijkl}(t + 1) = W_{ijkl}(t) + \alpha(t)[x_i(t) - W_{ijkl}(t)]^2 \quad (9)$$

where $j \in W_j$

αof α(t) is a value empirically determined and takes a value ranging from 0 to 1. α is set so as to reduce with the elapse of time t. Further, the definition of $j \in N_j$ is a kind of function which is also set empirically so as to reduce with the elapse of time.

Subsequently, the processes of above steps S2 to S4 are repeated many times corresponding to the number of input patterns, thereby ending the processing of FIG. 4.

The input sampled data is sorted through the processes of above steps S1 to S5, replaced by a predetermined representative sound value, and then output to the code converting section 14. The code converting section 14 gives a predetermined index data to each representative sound value input thereto, the index data being output to the code book creating section 15. In the code book creating section 15, a code book is created depending on the applied index data for the representative sound value.

A practical example of the code book created by the above-explained sound data compressing apparatus 10 will be described below with reference to input sound data shown in FIG. 5.

It is supposed in FIG. 5 that the input sound data is sampled at sampling intervals $t_n$ (n=1, 2, 3, ..., n) to provide sampled data in sampling levels of 8 bits (256 levels), the sampled data is blocked in units of eight pieces $t_1$–$t_8$, i.e., with the number of dimensions K=8 (8 bytes), as one input sound data pattern for sorting, and further the number of the sampled data is SD.

The code book number calculated for such an input sound data pattern will now be compared between the case of using the LBG algorithm in the prior art vector quantizing method explained before and the case of using the three-dimensional Kohonen map in this embodiment.

Figure 12:
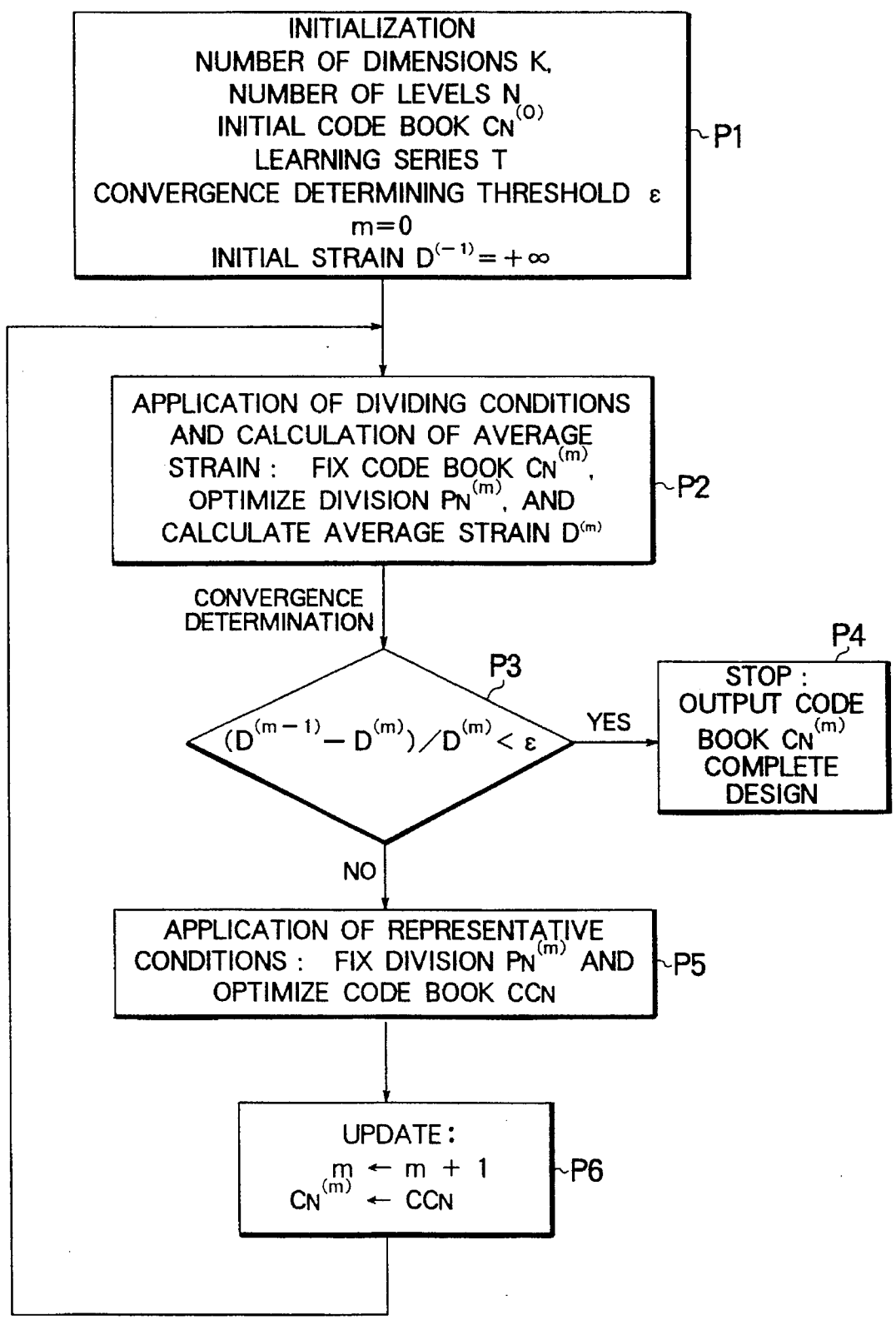
FIG. 12 is a flowchart showing an LBG algorithm for use with a prior art vector quantizing method.
Figure 13:
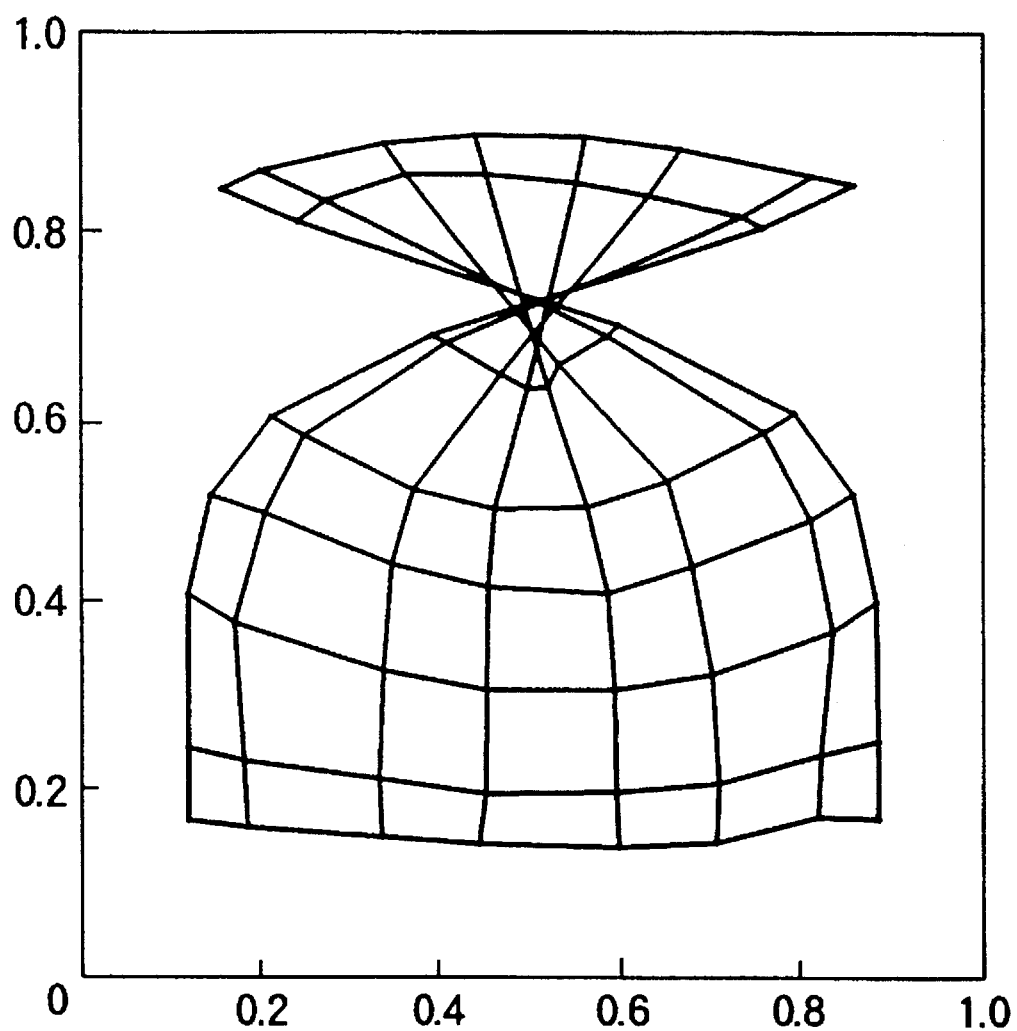
FIG. 13 is a graph for explaining the occurrence of a "distortion" due to a prior art two-dimensional Kohonen map.

When the prior art vector quantization is carried out on an assumption that the number of vector dimensions is K and the sampling rate is R, the memory capacity necessary for the code book, i.e., the number of levels N, is provided by $N=2^{K \cdot N}$ as explained before in connection with the prior art. Given K=8 and R=8 as shown in FIG. 5, by way of example, the necessary memory capacity is so enormous on the order of $2^{8 \cdot 8}=2^{64}$ as to widely exceed the memory capacity that is feasible by the technology at the present state-of-art. One method for creating a code book while holding down the number of levels N below a certain value is the LBG algorithm explained before in connection with the prior art and shown in FIG. 12. The LBG algorithm employs in step P2 the Voronoi division as application of the dividing conditions. In this case, as mentioned above, the actual number of the sampled data is assumed to be SD=10,000. While various calculation methods have been proposed for determining the conditions for the Voronoi division, the number of times of operations required for one late calculation method is obtained by the following equation (11):

$$K_n^{(K/2)+1} + K^3 n^{(K/2)} \log n \text{ (times)} \quad (11)$$

The equation (11) is calculated as follows for each of conditions below:

(a) when N=500 and K=2,524,858 limes (b) when N=500 and K=8, about $4.49 \times 10^{14}$ times (c) when N=10,00 and K=8, $8.5 \times 10^{20}$ times Thus, when the number of dimensions is K=2, the number of times of operations is within the practicable range of time for calculations, but when the number of dimensions is K=8, the calculations require the enormous number of times of operations. It is therefore impossible to complete calculations for the actual input sound data within the practicable range of time by using any existing computers.

On the other hand, when the vector quantization is performed by utilizing the Kohonen algorithm which provides a result equivalent to that obtainable with the Voronoi division, the number of times of operations required is determined by the following equation (12) from the number of levels N, the number of the sampled data SD, the number of dimensions K and the learning times L:

$$N \cdot SD \cdot K \cdot L \text{ (times)} \quad (12)$$

Given N=1000, SD=10,000, K=8 and L=100, the equation (11) is calculated below:

$N \cdot SD \cdot K \cdot L = 1,000 \times 10,000 \times 8 \times 100 = 8 \times 10^9$ (times) Thus, the actual input sound data can be calculated within the practicable range of time by using existing computers.

Accordingly, even when the code book number is equal or larger than that obtained by the LBG algorithm, the operations can be completed within the practicable range of time. Further, since this embodiment employs the three-dimensional Kohonen map shown in FIG. 2 which can improve a "distortion" conventionally occurred in the case of using the two-dimensional Kohonen map, a code book being able to separate input sound data satisfactorily can be obtained at the much less number of times of operations.

As a result, by utilizing the three-dimensional Kohonen map to execute the learning operations process for sorting of an input sound data pattern, it is possible to solve the problem of a "distortion" conventionally encountered in using the two-dimensional Kohonen map, cut down the number of times of operations necessary for the learning, obtain operations results of code book data within the practicable range of time for operations by using existing computers, as well as to create a code book capable of sorting the input sound data pattern satisfactorily.

It is a matter of course that although the number of dimensions is set to be K=8 in this embodiment, a code book capable of sorting the input sound data pattern satisfactorily at the less number of times of operations and in a less operations time than required for the conventional LBG algorithm can be obtained even with the larger number of dimensions by using the three-or-more or n-dimensional Kohonen map in which initial loads are set depending on an input signal. Further, by deliberately setting initial values of the synapse loads for sorting input sound data in the learning process with the aid of the three-dimensional Kohonen map, it is also possible to obtain a code book capable of sorting the input sound data satisfactorily at the less code book number.

FIGS. 6 to 10 show one embodiment of a sound data reproducing apparatus according to claims 3 and 4.

Figure 6:
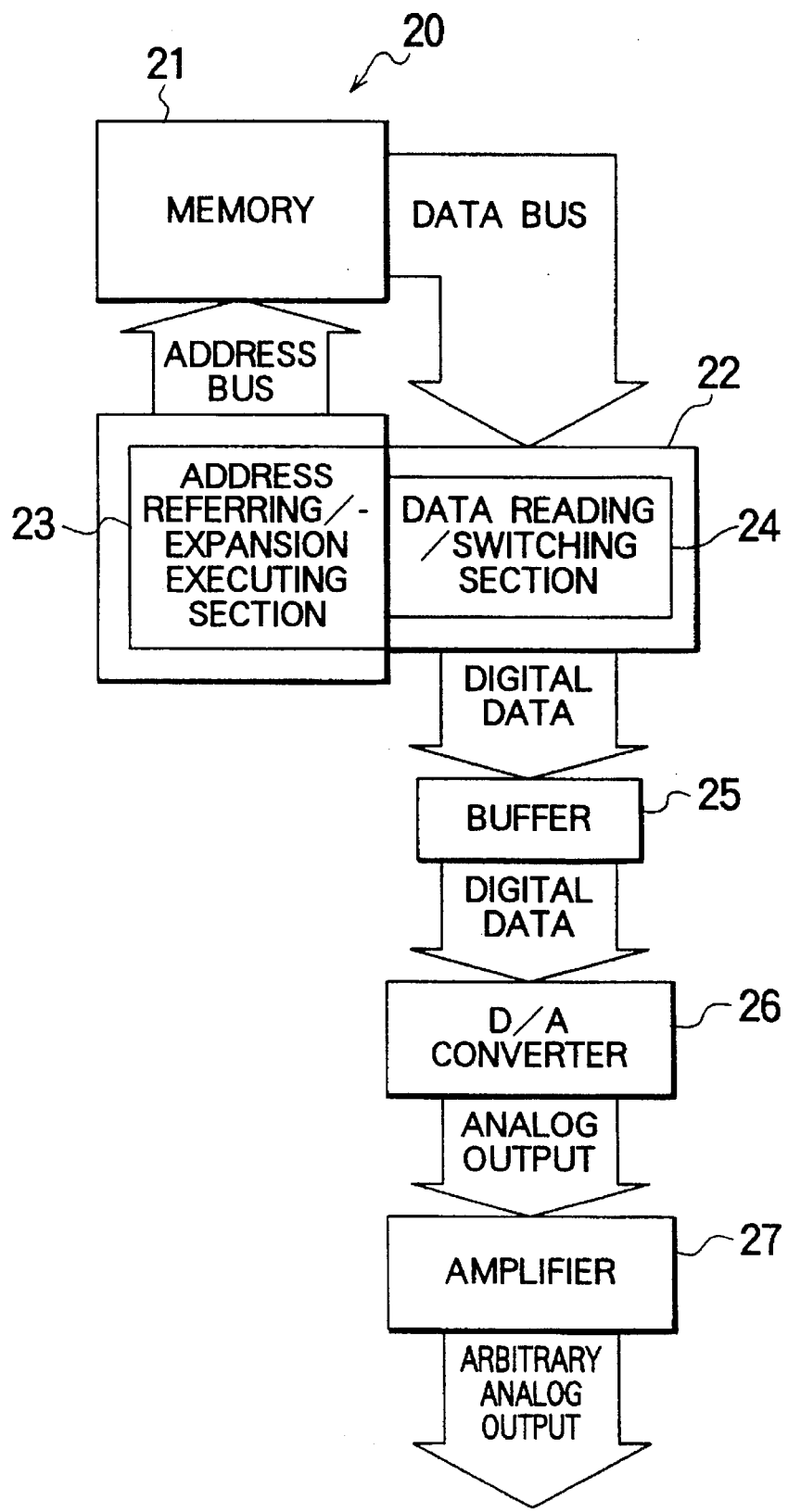
FIG. 6 is a block diagram of a sound data reproducing apparatus.

FIG. 6 is a block diagram of a sound data reproducing apparatus 20. The sound data reproducing apparatus 20 is constituted by a memory 21 for storing code book data (representative sound code data); a control unit 22 including an address referring/expansion executing section 23 for, in accordance with index data of code books input through a data reading/switching section 24 successively, converting the index data into data indicative of addresses in the memory 21 where corresponding code book data is stored, and the data reading/switching section 24 for switchingly reading the index data of the code book and the code book data both stored in the memory 21 and then switchingly outputting those data to the address referring/expansion executing section 23 and a buffer 25, respectively; the buffer 25 for temporarily storing the code book data read by the data reading/switching section 24 at the predetermined timing and outputting it to a D/A converter 26; the D/A converter 26 for D/A-converting the code book data input from the buffer 25 and outputting a predetermined analog signal to an amplifier 27; the amplifier 27 for amplifying the analog signal input from the D/A converter 26 and driving a speaker or the like (now shown), and so on, these components being interconnected by buses.

The memory (sound code storing means, reproduction sequence storing means) 21 is constituted by a ROM, RAM or the like, and stores the code book data given by a plurality of representative sound code data which are obtained as approximation data by sampling resources to be reproduced such as music data or voice data at predetermined sampling intervals to provide a series of sound data patterns, and then sorting those sound data patterns in units of the predetermined number of samples. Used as the above code book data is the code book data created by the sound data compressing apparatus 10 described as the above embodiment.

Figure 7:
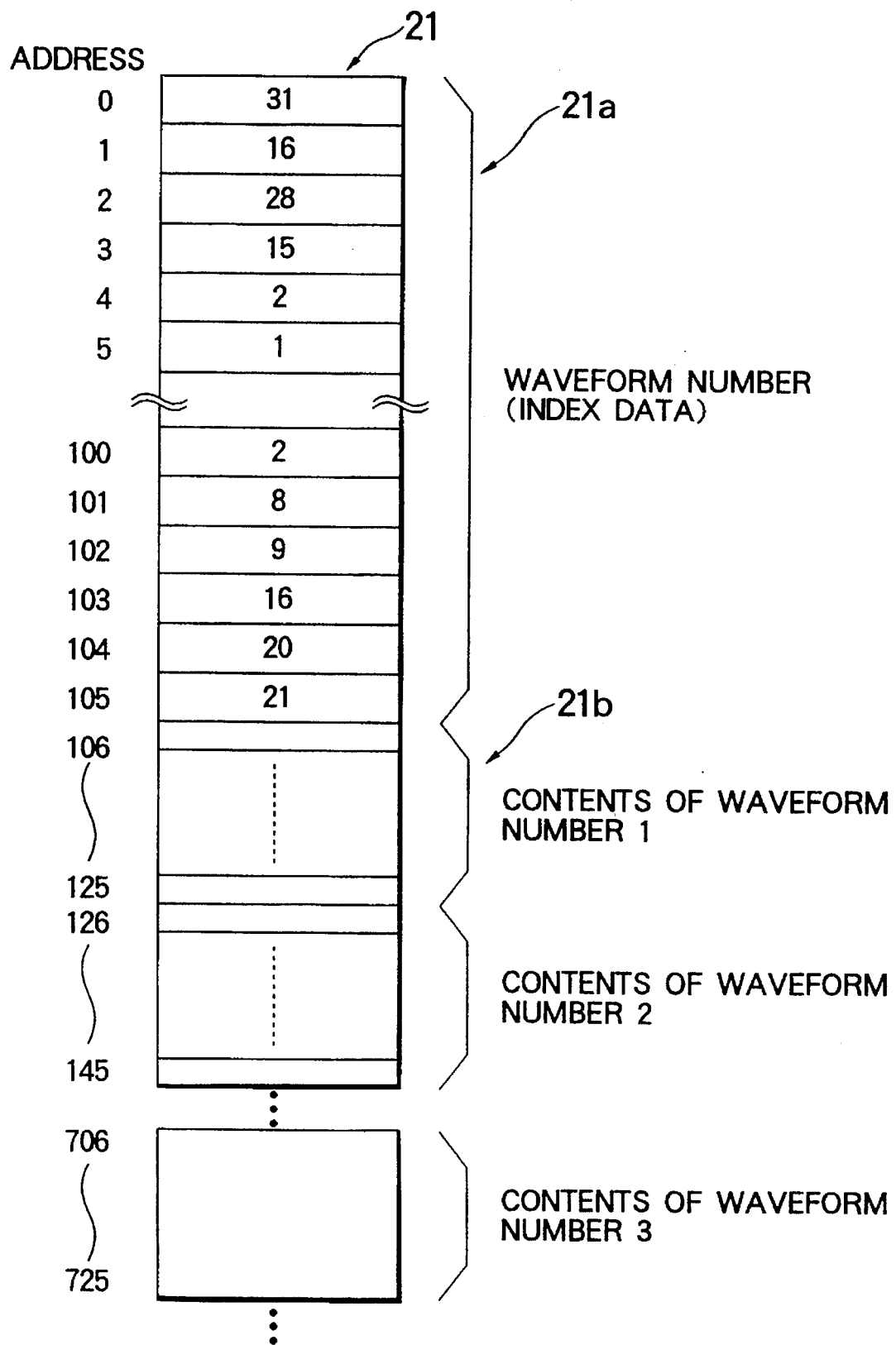
FIG. 7 is a diagram showing the configuration of a memory in FIG. 6.

A detailed exemplary configuration of the memory 11 is shown in FIG. 7. In FIG. 7, the memory 21 is constituted by a waveform number storage area 21a for storing waveform numbers as the index data of the code book data which represent a series of music data or voice data as resources to be reproduced, and a waveform contents storage area 21b for storing contents of each of the waveform numbers as contents of each of the code book data in units of area containing twenty memory addresses in one-to-one relation to the waveform numbers stored in the waveform number storage area 21a. In the illustrated example, address allocation is set such that a series of waveform number data corresponding to a series of sound data as resources to be reproduced are stored in memory addresses 0 to 105, the contents corresponding to the waveform number 1 are stored in memory addresses 106 to 125 subsequent to the address 106, the contents corresponding to the waveform number 2 are stored in memory addresses 126 to 145, and thereafter the contents corresponding to each of the subsequent waveform numbers are successively stored in each memory area containing to twenty addresses.

Figure 8:
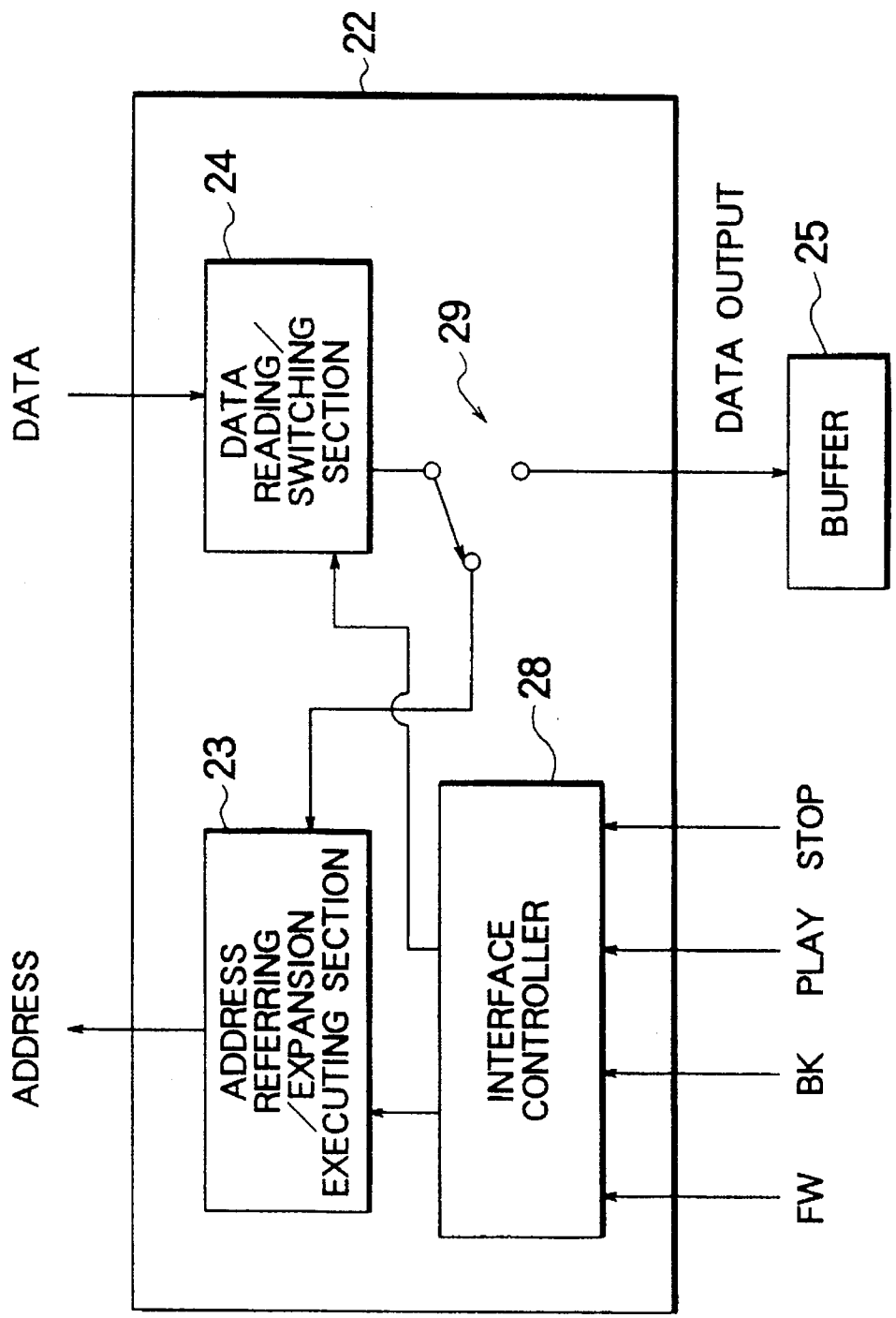
FIG. 8 is a block diagram of a control unit in FIG. 6.

The control unit 22 is constituted by, as shown in FIG. 8, the address referring/expansion executing section 23 for, in accordance with index data of code books input through the data reading/switching section 24 successively, converting the index data into data indicative of addresses in the memory 21 where corresponding code book data is stored, and transferring waveform contents stored in those addresses from the waveform number storage area 21a of the memory 21 to the data reading/switching section 24; the data reading/switching section (reading means) 24 for switchingly reading the waveform number and the contents for each waveform number respectively stored in the waveform number storage area 21a and the waveform contents storage area 21b of the memory 21, and then switchingly outputting the waveform number and the contents for each waveform number to the address referring/expansion executing section 23 and the buffer 25, respectively; an interface controller 28 for receiving any of external control signals (forward signal FW, backward signal BK, playback signal PLAY, and stop signal STOP) from a switch or the like (not shown) and transferring it to the address referring/ expansion executing section 23; a switch 29 for switching under control of the data reading/switching section 24 the output direction when the waveform number and the contents for each waveform number both read out of the memory 21 are output to the address referring/expansion executing section 23 and the buffer 25, respectively. Also, the address referring/expansion executing section 23 and the data reading/switching section 24 execute processes in accordance with later-described flowcharts of reproduction processing programs stored in a not-shown ROM within the control unit 22. Further, though not shown, the data reading/ switching section 24 incorporates an address counter which is used when reading the address data in the memory 21.

The buffer 25 temporarily stores the contents for each waveform number output from the data reading/switching section 24 in the control unit 22 at the conversion timing of the D/A converter 26, and then outputs the stored contents for each waveform number to the D/A converter 26.

The D/A converter (reproducing means) 26 D/A-converts the contents for each waveform number input from the buffer 25 and outputs a predetermined analog sound signal to the amplifier 27. The amplifier 27 amplifies the analog sound signal input from the D/A converter 26 and outputs it to a speaker or the like (now shown).

The operation of this embodiment will now be described.

Figure 9:
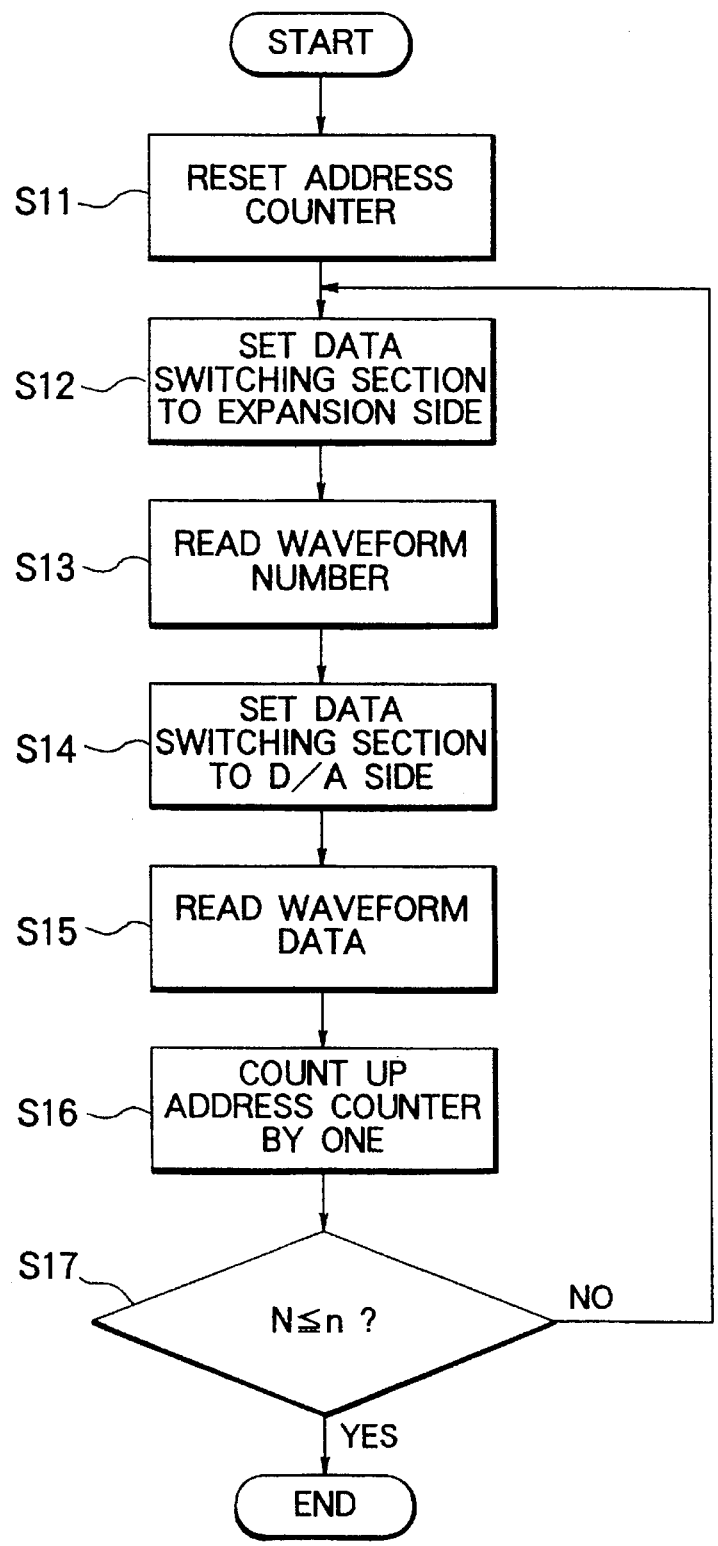
FIG. 9 is a flowchart of a sound data expanding algorithm executed by the sound data reproducing apparatus in FIG. 6.
Figure 10:
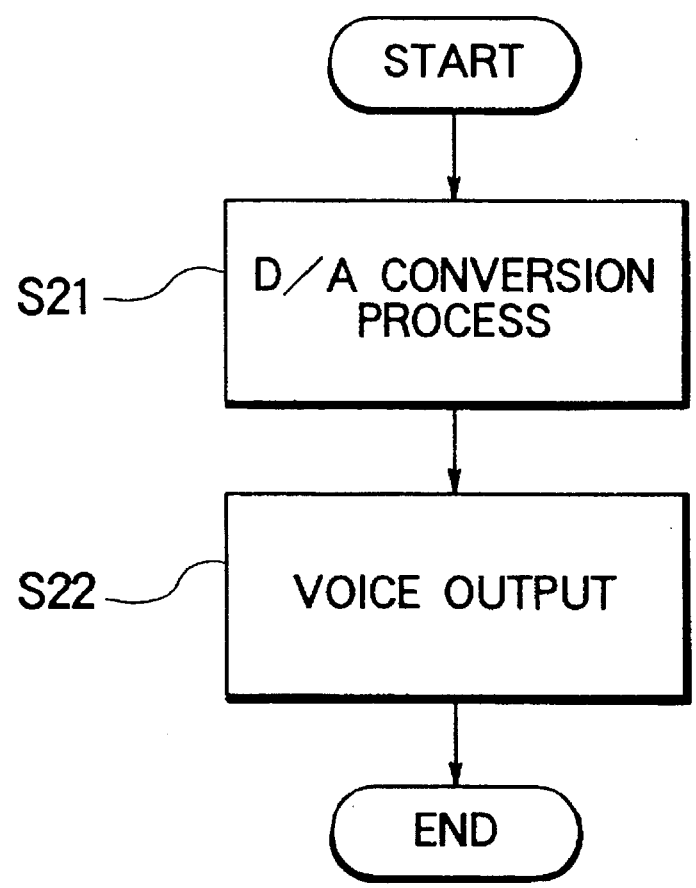
FIG. 10 is a flowchart of a sound data D/A conversion process executed by the sound data reproducing apparatus in FIG. 6.
Figure 11:
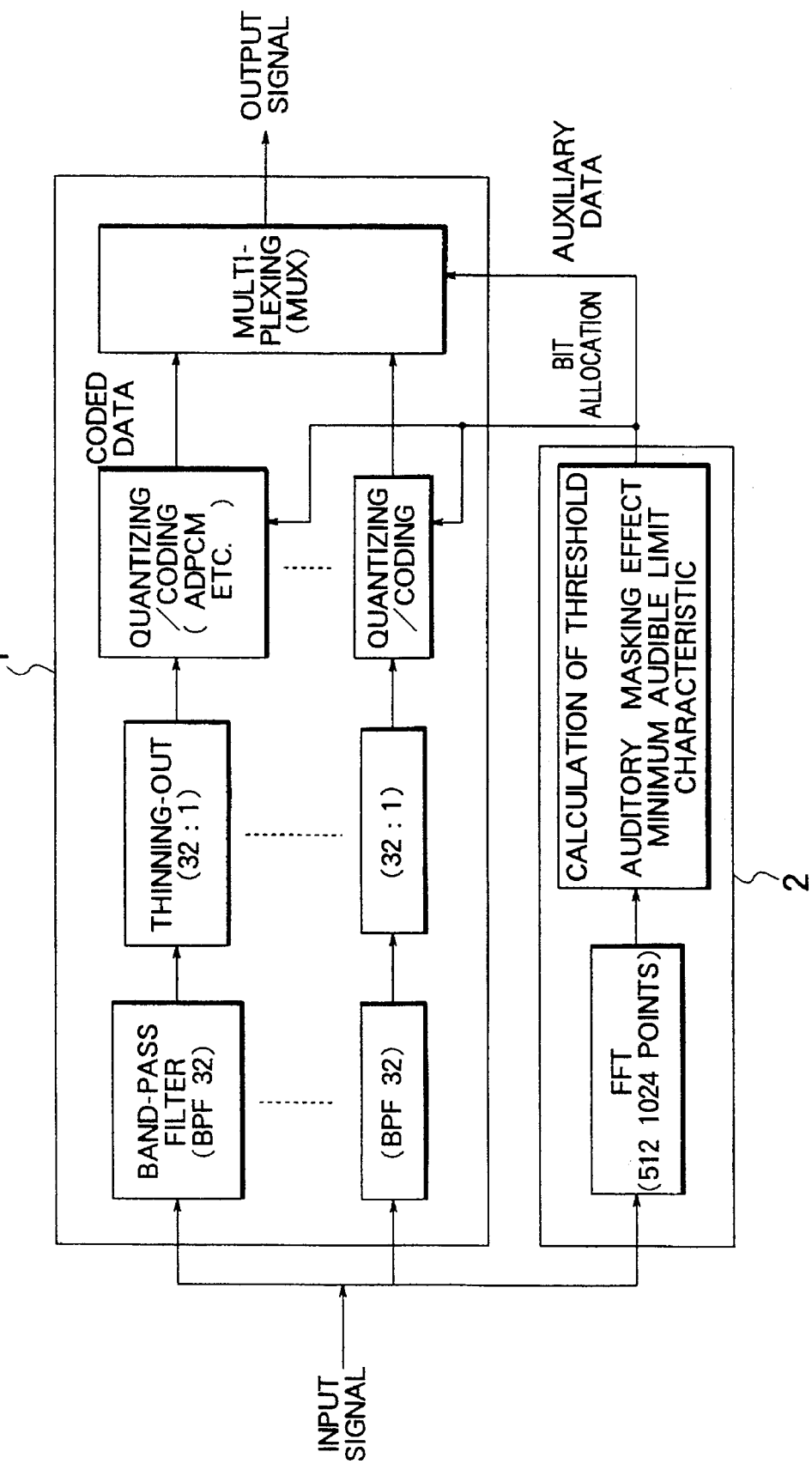
FIG. 11 is a block diagram based on a basic algorithm of a prior art high-efficient coding technique for audio signals using subband coding and auditory characteristics.

First, when the playback signal PLAY is input to the control unit 22 in FIG. 8, the address referring/expansion executing section 23 and the data reading/switching section 24 execute processes in accordance with flowcharts of reproduction processing programs shown in FIGS. 9 and 10.

In FIG. 9, the address counter in the data reading/switching section 24 is first reset in step S11, and the switch 29 is then changed over in step S12 by the data reading/switching section 24 for connection to the side of the address referring/expansion executing section 23. After that, a waveform number (index data) is read in step S13 out of the waveform number storage area 21a of the memory 21, shown in FIG. 7, and transferred to the address referring/expansion executing section 23. Depending on the waveform number transferred from the data reading/switching section 24, the address referring/expansion executing section 23 converts it into corresponding address data for the waveform number storage area 21a of the memory 21. When the "waveform number 31", for example, is input, it is converted into an address of 105+(20×30)+1, i.e., an address 706, from the configuration of the memory 21 shown in FIG. 7 and the waveform contents stored in the waveform contents storage area 21b at twenty addresses following the address 706 is transferred to the data reading/switching section 24.

Subsequently, the data reading/switching section 24 changes over the switch 29 for connection to the side of the D/A converter 26 (or the buffer 25) in step S14, and the transferred waveform contents is read in switch S15 to be temporarily stored in the buffer 25, followed by transfer to the D/A converter 26. Thereafter, the address counter in the data reading/switching section 24 is counted up by one in step S16, and it is determined in step S17 whether a count value n of the address counter exceeds the count number N "105" corresponding to 105 addresses in the waveform number storage area 21a of the memory 21 or not. If the count value does not reach N, then the process returns to step S12 for repeatedly executing the processing of above steps S12 to S16. If it exceeds N, then the process is ended.

Further, in step S21 of FIG. 10, the D/A converter 26 converts the waveform contents (code book data), transferred from the data reading/switching section 24 via the buffer 25 as a result of the above-mentioned process in step S14 of FIG. 19, into a predetermined analog signal through D/A conversion and then outputs it to the amplifier 27. After that, in step S22, the amplifier 27 amplifies the analog signal input from the D/A converter 26 and drives a speaker or the like (not shown), thereby ending the reproduction processing.

The processes of FIGS. 9 and 10 are executed in parallel to reproduce a series of sound data stored in the memory 21. During the reproduction processing, when the stop signal STOP, the forward signal FW or the backward signal BK, for example, is input to the interface controller 28 in FIG. 8, a process of stopping, fast forwardly advancing, or fast backwardly advancing the sound data under the reproduction is executed depending on the external control signal.

Accordingly, by storing the code book data created by the sound data compressing apparatus 10, explained as the above embodiment, in the memory 21 beforehand, the sound data reproducing apparatus 20 can store music data and voice data, as resources to be reproduced, in the form of code book data after compress i on by coding with a less memory capacity, can reproduce the sound data simply by reading the code book data out of the memory in accordance with a simple algorithm without requiring complicated operations processing, and further can simplify a circuit configuration while cutting down the number of parts to a large extent. As a result, a small-size sound data compressing apparatus is realized at a lower cost.

Thus, according to the invention as claimed in claim 1, a plurality of division regions, in which representative sound values for sorting and making approximation of the input sound data pattern in accordance with change in the input sound data pattern are loaded as the centroids, are formed into a three-or-more or n-dimensional correlation map by map forming means, which also modifies the representative sound values as the centroids of the respective division regions depending on change in the input sound data pattern to update the n-dimensional correlation map, and coding means converts the representative sound values, which are loaded in the respective division regions of the correlation map, into predetermined code data, thereby compressing the input sound data. In the map forming means for use with the above case, initial value setting means sets initial values, which are weighted for each of the plural division regions, so as to set the plural representative sound values, presenting means presents the input sound data pattern to the initial values for the respective plural division regions set by the initial value setting means, distance calculating means calculates distances between the input sound data pattern presented by the presenting means and the initial values for the respective plural division regions in directions of three-or-more or n-dimensions, and update means updates the plural representative sound values for the respective plural division regions based on a result calculated by the distance calculating means, thereby updating the three-or-more or n-dimensional correlation map. Therefore, since the update operations processing for sorting the input sound data pattern in the larger number of dimensions is carried out by using the three-or-more or n-dimensional correlation map, the number of times of operations can be cut down remarkably, the sorting result can be obtained within the practical range of time for operations by existing computers, and further the input sound data pattern can be sorted satisfactorily with the less number of the representative sound values than conventionally.

According to the invention as claimed in claim 3, a sound data reproducing apparatus is arranged such that a plurality of representative sound code data for sorting and making approximation of a series of sound data patterns, which are obtained by sampling resources to be reproduced such as music data or voice data at predetermined time intervals, in units of the predetermined number of samples are stored in the sound code storing means, reproduction sequence data to reproduce the plural representative sound code data stored in the sound code storing means in the same sequence as the input sound data patterns is stored in the reproduction sequence storing means, the reading means selectively reads the plural representative sound code data stored in the sound code storing means in accordance with the reproduction sequence data stored in the reproduction sequence storing means, and the reproducing means reproduces the representative sound code data read by the reading means. In this case, the plural representative sound code data stored in the sound code storing means is provided as, for example, code data resulted from the coding means by converting the representative sound values obtained from the three-or-more or n-dimensional correlation map by the map forming means in accordance with the sound data compressing method according to claim 1. Therefore, music data and voice data, as resources to be reproduced, can be stored in the form of representative sound code data after compression by coding with a less memory capacity, the sound data can be reproduced simply by reading the representative sound code data out of the memory in accordance with a simple algorithm without requiring complicated operations processing, and further a circuit configuration can be simplified. As a result, a small-size sound data compressing apparatus is realized at a lower cost.

I claim:

1. A sound data compressing method with which, when a series of sound data are sampled at predetermined time intervals and input as a sound data pattern having a predetermined number of samples, said input sound data pattern is replaced by an representative sound value for sorting and approximation of said input sound data pattern, said representative sound value being coded, thereby compressing said series of sound data, said method including:

map forming means for forming a plurality of division regions, in which representative sound values for sorting and making approximation of said input sound data pattern in accordance with change in said input sound data pattern are loaded as the centroids, into a three-or-more dimensional correlation map, and for modifying the representative sound values as the centroids of said respective division regions depending on change in said input sound data pattern to update said correlation map, and coding means for converting the representative sound values, which are loaded in said respective division regions of said correlation map formed by said map forming means, into predetermined code data, whereby the representative sound values as the centroids of said respective division regions are modified depending on change in said input sound data pattern to update said three-or-more or n-dimensional correlation map, and the representative sound values of said updated correlation map are converted into predetermined code data, thereby compressing the input sound data.

2. A sound data compressing method according to claim 1, wherein said map forming means comprises:

initial value setting means for setting initial values, which are weighted for each of said plural division regions, so as to set said plural representative sound values, presenting means for presenting said input sound data pattern to the initial values for said respective plural division regions set by said initial value setting means, distance calculating means for calculating distances between said input sound data pattern presented by said presenting means and the initial values for said respective plural division regions in directions of three-or-more dimensions, and update means for updating the plural representative sound values for said respective plural division regions based on a result calculated by said distance calculating means, thereby updating said three-or-more dimensional correlation map.

* * * * *